(12) United States Patent
Takahashi et al.

(10) Patent No.: US 9,224,757 B2
(45) Date of Patent: Dec. 29, 2015

(54) DC-DC CONVERTER AND MANUFACTURING METHOD THEREOF

(75) Inventors: Kei Takahashi, Kanagawa (JP); Yoshiaki Ito, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 355 days.

(21) Appl. No.: 13/307,084

(22) Filed: Nov. 30, 2011

(65) Prior Publication Data
US 2012/0140523 A1 Jun. 7, 2012

(30) Foreign Application Priority Data
Dec. 3, 2010 (JP) .................................. 2010-270316

(51) Int. Cl.
| | |
|---|---|
| G05F 1/569 | (2006.01) |
| H01L 27/12 | (2006.01) |
| H02M 3/158 | (2006.01) |
| H02M 3/335 | (2006.01) |
| H02M 1/00 | (2007.01) |

(52) U.S. Cl.
CPC ........ *H01L 27/1225* (2013.01); *H01L 27/1251* (2013.01); *H02M 3/158* (2013.01); *H02M 3/33523* (2013.01); *H02M 2001/0006* (2013.01)

(58) Field of Classification Search
USPC .................. 323/266, 269, 271, 272, 274, 276, 323/284–287, 300; 327/403; 361/18, 746; 438/104
See application file for complete search history.

(56) References Cited

U.S. PATENT DOCUMENTS

| | | | |
|---|---|---|---|
| 5,627,460 A | * | 5/1997 | Bazinet et al. ................ 323/288 |
| 5,731,856 A | | 3/1998 | Kim et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Adolf Berhane
*Assistant Examiner* — Gary Nash
(74) *Attorney, Agent, or Firm* — Fish & Richardson P.C.

(57) ABSTRACT

A DC-DC converter is driven by single high input voltage, and includes a voltage converter circuit and a control circuit. The increase of the occupied area of the DC-DC converter is suppressed. The DC-DC converter includes an input terminal to which input voltage is applied; a voltage converter circuit connected to the input terminal, and including a first transistor; a control circuit configured to control the voltage converter circuit, and including a second transistor including a silicon material in a channel formation region; and a third transistor provided between the input terminal and the control circuit, and configured to convert the input voltage into power supply voltage that is lower than the input voltage. The first transistor and the third transistor include an oxide semiconductor material in channel formation regions. The first transistor and the third transistor are stacked over the second transistor with an insulating film provided therebetween.

21 Claims, 6 Drawing Sheets

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 * | 12/2008 | Kaji et al. | 438/308 |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,044,464 B2 | 10/2011 | Yamazaki et al. | |
| 8,367,488 B2 | 2/2013 | Ichiryu et al. | |
| 8,508,963 B2 | 8/2013 | Sohma | |
| 8,581,309 B2 | 11/2013 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0316663 A1 * | 12/2008 | Martin et al. | 361/56 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0153115 A1 | 6/2009 | Henmi | |
| 2009/0189153 A1 * | 7/2009 | Iwasaki et al. | 257/43 |
| 2009/0243087 A1 * | 10/2009 | Nakamura et al. | 257/723 |
| 2009/0278122 A1 | 11/2009 | Hosono et al. | |
| 2009/0280600 A1 * | 11/2009 | Hosono et al. | 438/104 |
| 2009/0290387 A1 * | 11/2009 | Wheeler et al. | 363/21.01 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089417 A1 | 4/2011 | Yamazaki et al. | |
| 2011/0101339 A1 | 5/2011 | Yamazaki et al. | |
| 2011/0101351 A1 | 5/2011 | Yamazaki | |
| 2011/0304311 A1 | 12/2011 | Takahashi | |
| 2012/0049830 A1 | 3/2012 | Watanabe | |
| 2012/0057376 A1 | 3/2012 | Ito | |
| 2012/0086422 A1 | 4/2012 | Ito | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 11-233789 A | 8/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-235251 A | 8/2003 |
| JP | 2004-103957 A | 4/2004 |
| JP | 2004-273614 A | 9/2004 |
| JP | 2004-273732 A | 9/2004 |
| JP | 2009-094495 A | 4/2009 |
| JP | 2009-131062 A | 6/2009 |
| JP | 2009-148129 A | 7/2009 |
| JP | 2009-254110 A | 10/2009 |
| WO | 2004/114391 A1 | 12/2004 |
| WO | WO-2010/134234 | 11/2010 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

(56) References Cited

OTHER PUBLICATIONS

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

(56) References Cited

OTHER PUBLICATIONS

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film.Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

* cited by examiner

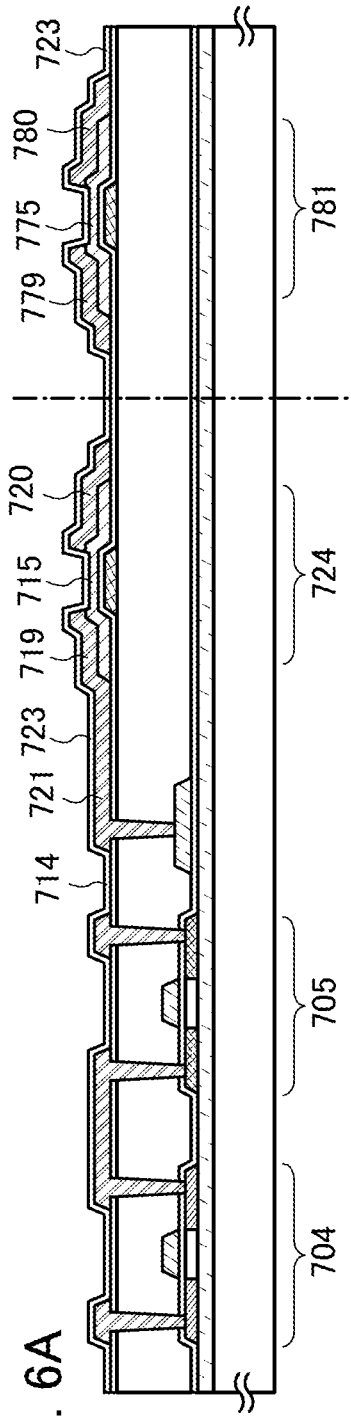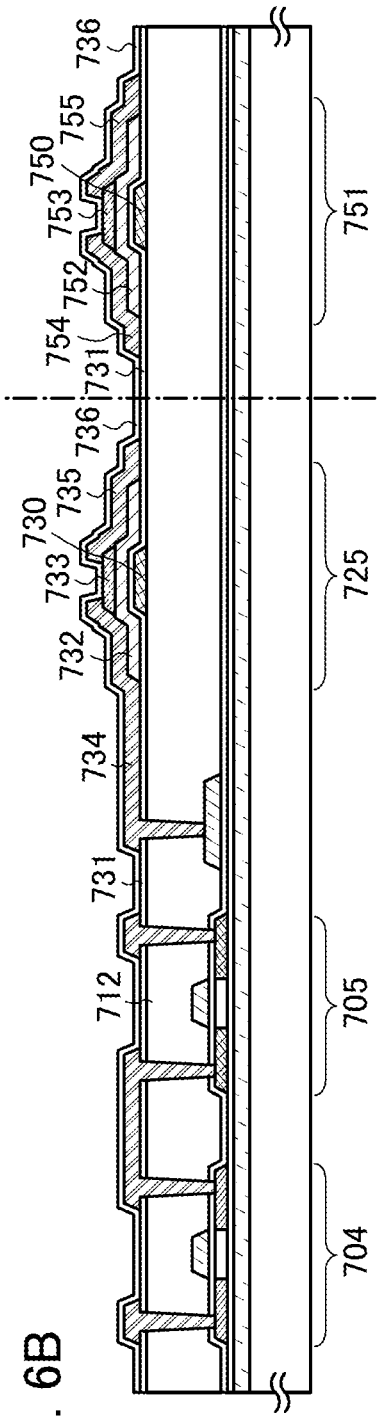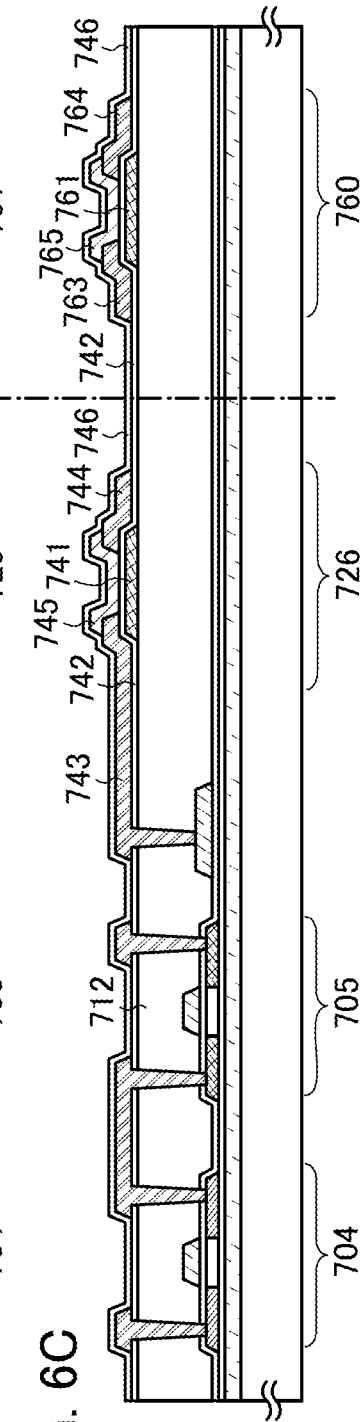

DC-DC CONVERTER AND MANUFACTURING METHOD THEREOF

BACKGROUND OF THE INVENTION

1. Field of the Invention

One embodiment of the disclosed invention relates to a DC-DC converter and a manufacturing method thereof.

2. Description of the Related Art

In recent years, DC-DC converters have been widely used in order to drive circuits which are driven by DC voltage that is different from input voltage because devices which need DC voltage sources have been diversified (see Patent Document 1, Patent Document 2, and Patent Document 3).

REFERENCE

[Patent Document 1] Japanese Published Patent Application No. 2009-148129
[Patent Document 2] Japanese Published Patent Application No. 2003-235251
[Patent Document 3] Japanese Published Patent Application No. 2009-254110

SUMMARY OF THE INVENTION

A DC-DC converter includes a voltage converter circuit and a control circuit which controls the voltage converter circuit. A power device which has high breakdown voltage is used for an element of the voltage converter circuit because high voltage can be applied. Such a voltage converter circuit using a power device can be driven only by high input voltage. As such a power device, an element including an oxide semiconductor material (e.g., a transistor which uses an oxide semiconductor film in a channel formation region) can be given for example.

In contrast, an element of the control circuit which controls the voltage converter circuit needs a high driving speed. As such an element which can provide a high driving speed, an element using a silicon material (e.g., a transistor formed using a silicon film for a channel formation region or a transistor formed using a single crystal silicon substrate) can be given as an example. However, high voltage cannot be applied to the element using a silicon material because the element does not have high breakdown voltage.

Since silicon has a narrow band gap, an avalanche breakdown in which electrons are generated like an avalanche might occur. When an avalanche breakdown occurs, the element is broken. In contrast, the oxide semiconductor has a wide band gap; thus, the avalanche breakdown does not easily occur and the element is less likely to be broken.

Here, the case where a DC-DC converter having a voltage converter circuit and a control circuit is driven only by single high input voltage is considered. The single input voltage is preferable in order to reduce an occupied area of the DC-DC converter. However, although the high input voltage can drive the voltage converter circuit, the high input voltage might break the control circuit because it is too high as the voltage of the control circuit. Accordingly, it is difficult to drive the DC-DC converter having a voltage converter circuit and a control circuit only by the single high input voltage.

Therefore, an element which decreases high input voltage is provided between an input terminal to which the high input voltage is applied and the control circuit. When the decreased voltage is supplied to the control circuit, there is no risk of breaking the control circuit.

The above-described power device may be used as such an element which decreases the high input voltage. However, the provision of the control circuit and the power device which decreases the voltage value of the high input voltage might increase the occupied area of the DC-DC converter.

In view of the above problems, an object of one embodiment of the disclosed invention is to provide a DC-DC converter which is driven by single high input voltage and includes a voltage converter circuit and a control circuit.

In addition, an object of one embodiment of the disclosed invention is to inhibit the increase of the occupied area of the DC-DC converter.

Further, an object of one embodiment of the disclosed invention is to decrease the number of manufacturing steps and manufacture cost in such a way that a power device of a voltage converter circuit and a power device which decreases input voltage are formed in the same process.

As the power device which decreases the voltage value of the single high input voltage and the power device of the voltage converter circuit, elements including an oxide semiconductor material which are semiconductor elements with high breakdown voltage are used; and as an element of the control circuit, a semiconductor element with low breakdown voltage, for example, an element using a silicon material is used. In addition, the power devices and the element of the control circuit overlap with each other.

Even when the semiconductor element with low breakdown voltage, for example, an element using a silicon material is used as the element of the control circuit, the power device decreases the voltage value of the high input voltage; therefore, there is no risk of damaging the control circuit.

It is possible to inhibit the increase of the occupied area of the DC-DC converter in order that the power devices and the element of the control circuit overlap with each other.

In addition, in one embodiment of the disclosed invention, the element including an oxide semiconductor material which is the power device of the voltage converter circuit and the element including an oxide semiconductor material which is a power device that decreases the input voltage are formed in the same process. Thus, the number of manufacturing steps and the manufacture cost can be reduced.

One embodiment of the disclosed invention relates to a DC-DC converter including: an input terminal to which input voltage is applied; a voltage converter circuit that is connected to the input terminal and includes a first transistor; a control circuit that is configured to control the voltage converter circuit and includes a second transistor including a silicon material in a channel formation region; and a third transistor that is provided between the input terminal and the control circuit and configured to convert the input voltage into power supply voltage that is lower than the input voltage. The first transistor and the third transistor are transistors including an oxide semiconductor material in channel formation regions, and the first transistor and the third transistor are stacked over the second transistor with an insulating film provided between the first and third transistors and the second transistor.

One embodiment of the disclosed invention relates to a method for manufacturing a DC-DC converter, including the steps of: forming a first transistor using a silicon material in a first channel formation region, over an insulating surface; forming an insulating film covering the first transistor; forming a second transistor including an oxide semiconductor material in a second channel formation region and a third transistor using the oxide semiconductor material in a third channel formation region over the insulating film; in which a voltage converter circuit includes the second transistor; a control circuit configured to control the voltage converter circuit includes the first transistor; and the third transistor is provided between an input terminal and the control circuit, and converts input voltage applied to the input terminal into power supply voltage that is lower than the input voltage.

According to one embodiment of the disclosed invention, the oxide semiconductor material is any one of an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor which are two-component metal oxides; an In—O-based oxide semiconductor, a Sn—O-based oxide semiconductor, and a Zn—O-based oxide semiconductor which are one-component metal oxides.

According to one embodiment of the disclosed invention, the voltage converter circuit is a step-down voltage converter circuit.

According to one embodiment of the disclosed invention, the voltage converter circuit is a flyback voltage converter circuit.

According to one embodiment of the disclosed invention, the voltage converter circuit is a forward voltage converter circuit.

Note that the ordinal numbers such as "first" and "second" are used for convenience and do not denote the order of steps and the stacking order of layers. In addition, the ordinal numbers in this specification do not denote particular names which specify the present invention.

According to the disclosed invention, a DC-DC converter which is driven by single high input voltage and has a voltage converter circuit and a control circuit can be obtained.

According to one embodiment of the disclosed invention, the increase of the occupied area of the DC-DC converter can be suppressed.

In one embodiment of the disclosed invention, the number of manufacturing steps and manufacture cost can be decreased because a power device of a voltage converter circuit and a power device which decreases input voltage are formed in the same process.

BRIEF DESCRIPTION OF THE DRAWINGS

FIGS. 6A to 6C are cross-sectional views each illustrating a layered structure of a transistor.

DETAILED DESCRIPTION OF THE INVENTION

Figure 1:
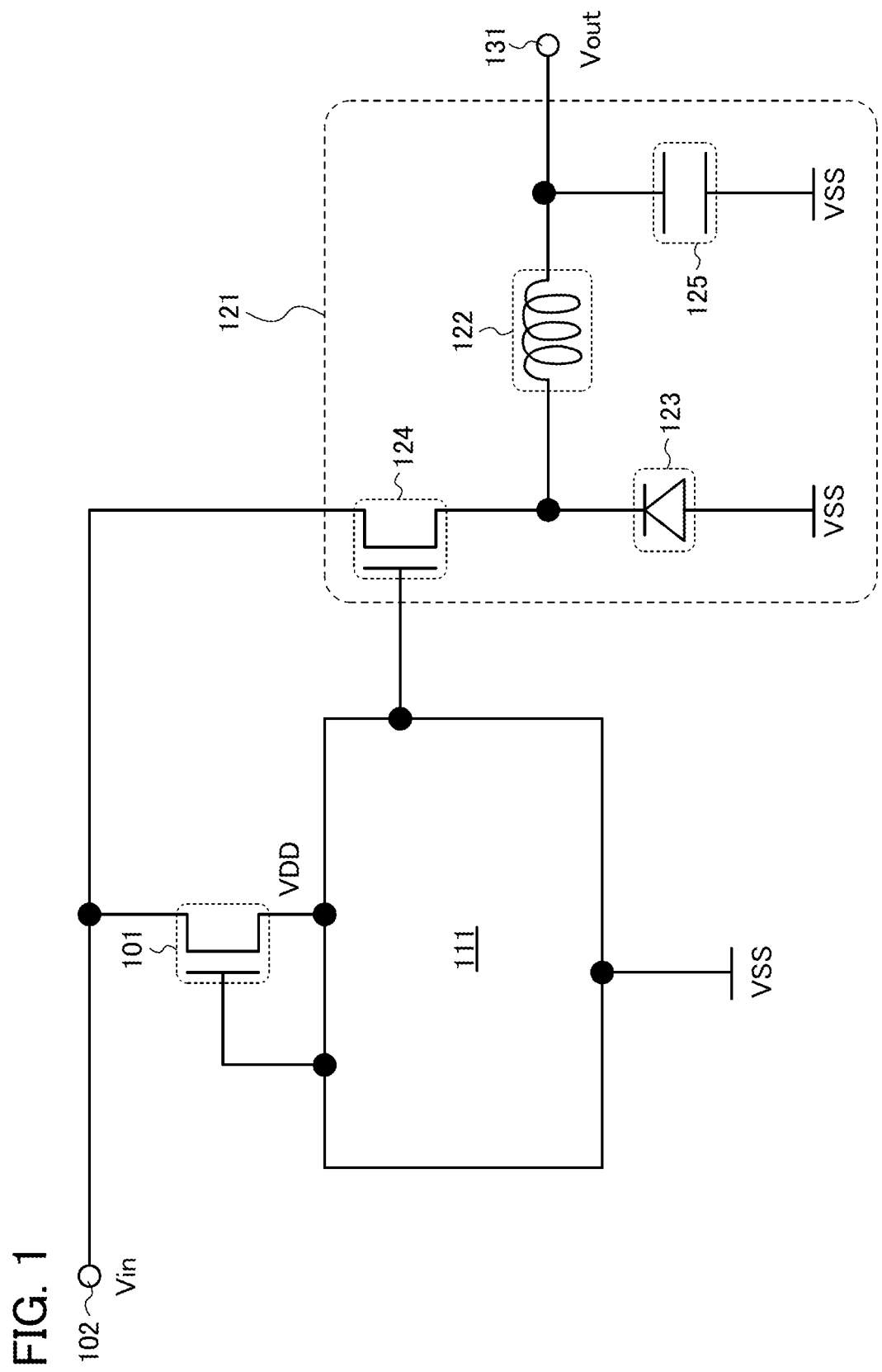
FIG. 1 is a circuit diagram of a DC-DC converter.

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the present invention is not construed as being limited to description of the embodiments. Note that, in the drawings hereinafter illustrated, the same portions or portions having similar functions are denoted by the same reference numerals, and repeated description thereof will be omitted.

Note that in the invention disclosed in this specification, a semiconductor device refers to an element or a device which functions by utilizing a semiconductor and includes, in its category, an electric device including an electronic circuit, a display device, a light-emitting device, and the like and an electronic appliance on which the electric device is mounted.

<Circuit Structure>

A DC-DC converter illustrated in FIG. 1 includes a control circuit 111, a voltage converter circuit 121, an input terminal 102 to which input voltage Vin is applied, a transistor including an oxide semiconductor material in a channel formation region, for example, a transistor 101 which is a transistor including an oxide semiconductor film in a channel formation region (hereinafter referred to as an oxide semiconductor transistor), and an output terminal 131 which outputs output voltage Vout which is output from the voltage converter circuit 121.

One of a source and a drain of the transistor 101 is connected to the input terminal 102 to which the input voltage Vin is applied and one of a source and a drain of a transistor 124 in the voltage converter circuit 121. The other of the source and the drain and a gate of the transistor 101 are connected to the control circuit 111.

The transistor 101 which is an oxide semiconductor transistor is a power device which can withstand high voltage. The input voltage Vin applied to the one of the source and the drain of the transistor 101 is converted into power supply voltage VDD having a value which is lower than a value of the input voltage Vin based on gate voltage applied to the gate of the transistor 101.

As the input voltage Vin, voltage from a power source for family use which is subjected to AC-DC conversion is used for example. When the voltage from a power source for family use which is subjected to AC-DC conversion is used as the input voltage Vin, an effective value of the input voltage Vin is 141 V. Therefore, the input voltage Vin which is such high voltage might damage the control circuit 111. Therefore, the provision of an oxide semiconductor transistor which is a power device with high breakdown voltage between the input terminal 102 to which the input voltage Vin is applied and the control circuit 111 can prevent the damage of the control circuit 111.

The transistor 101 is a transistor including an oxide semiconductor film in a channel formation region as described above.

As a material used for such an oxide semiconductor film, the following oxide semiconductors can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O- based oxide semiconductor which are two-component metal oxides; an In—O-based oxide semiconductor, a Sn—O-based oxide semiconductor, and a Zn—O-based oxide semiconductor which are one-component metal oxides; or the like. Note that a structure and a manufacturing process of a transistor (an oxide semiconductor transistor) having an oxide semiconductor film in a channel formation region will be described later.

The control circuit 111 is electrically connected to the other of the source and the drain of the transistor 101, the gate of the transistor 101, and the voltage converter circuit 121. Further, power supply voltage VSS having a lower value than power supply voltage VDD is applied to the control circuit 111. As the power supply voltage VSS, ground voltage GND may be used for example.

Figure 2:
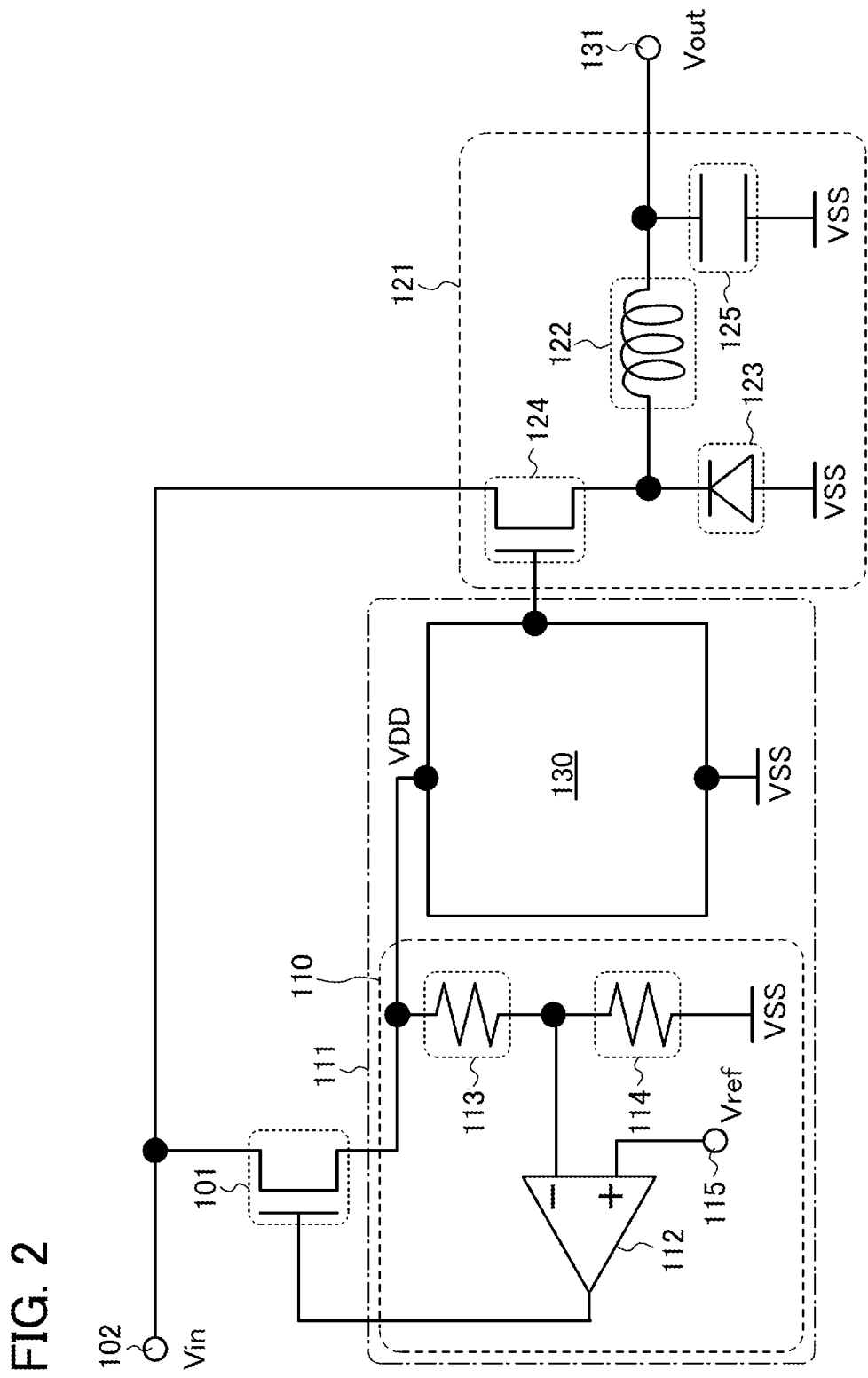
FIG. 2 is a circuit diagram of a DC-DC converter.

FIG. 2 is an example of a detailed circuit configuration of the control circuit 111 illustrated in FIG. 1.

The control circuit 111 in FIG. 2 includes an internal voltage generation circuit (also referred to as a "regulator") 110 and an internal control circuit 130. The internal voltage generation circuit 110 is a circuit which generates the power supply voltage VDD and includes an operational amplifier 112, a resistor 113, and a resistor 114.

An inverting input terminal of the operational amplifier 112 is electrically connected to one terminal of the resistor 113 and one terminal of the resistor 114. A non-inverting input terminal of the operational amplifier 112 is electrically connected to a terminal 115 to which reference voltage Vref is applied. An output terminal of the operational amplifier 112 is connected to the gate of the transistor 101.

Transistors included in the operational amplifier 112 may be transistors which can be driven at high speed, for example, transistors including a silicon material in a channel formation region. Note that a structure and a manufacturing process of the transistors in which a silicon material is used for a channel formation region will be described later.

In the case where a silicon material is used for a channel formation region, an n-channel transistor and a p-channel transistor can be obtained. When transistors including silicon in a channel formation region are used as the transistors included in the operational amplifier 112, the transistors can be driven at high speed, and can be an n-channel transistor or a p-channel transistor.

The one terminal of the resistor 113 is electrically connected to the inverting input terminal of the operational amplifier 112 and the one terminal of the resistor 114. The other terminal of the resistor 113 is electrically connected to the other of the source and the drain of the transistor 101 and a first terminal of the internal control circuit 130.

The one terminal of the resistor 114 is electrically connected to the one terminal of the resistor 113 and the inverting input terminal of the operational amplifier 112. The power supply voltage VSS is applied to the other terminal of the resistor 114.

The internal control circuit 130 is a circuit which performs voltage control or current control. As an example of the voltage control or the current control, a pulse width modulation (PWM) control and a hysteresis control can be given, for example. In this embodiment, the power supply voltage VDD is converted into gate voltage applied to a gate of the transistor 124, by the internal control circuit 130. In accordance with the gate voltage, the input voltage Vin is converted into the output voltage Vout.

The first terminal of the internal control circuit 130 is electrically connected to the other of the source and the drain of the transistor 101 and the other terminal of the resistor 113. The power supply voltage VSS is applied to a second terminal of the internal control circuit 130. In addition, a third terminal of the internal control circuit 130 is electrically connected to the gate of the transistor 124. Although not illustrated, part of the output voltage Vout is fed back to the internal control circuit 130. Such part of the output voltage Vout may be generated in such a way that a voltage divider which is electrically connected to the output terminal 131 which outputs the output voltage Vout is provided and the output voltage Vout is divided by the voltage divider.

The voltage converter circuit 121 in FIG. 2 is a step-down voltage converter circuit. The voltage converter circuit 121 in FIG. 2 includes the transistor 124, a diode 123, a coil 122, and a capacitor 125.

The one of the source and the drain of the transistor 124 is connected to the one of the source and the drain of the transistor 101 and the input terminal 102 to which the input voltage Vin is applied. The other of the source and the drain of the transistor 124 is electrically connected to an output terminal of the diode 123 and one terminal of the coil 122. The gate of the transistor 124 is electrically connected to the third terminal of the internal control circuit 130.

Similarly to the transistor 101, an oxide semiconductor transistor which is a power device is used as the transistor 124. When an oxide semiconductor transistor is used as the transistor 124, damage of the transistor 124 by application of the input voltage Vin which is high voltage can be inhibited.

The output terminal of the diode 123 is electrically connected to the other of the source and the drain of the transistor 124 and the one terminal of the coil 122. The power supply voltage VSS is applied to the input terminal of the diode 123.

The one terminal of the coil 122 is electrically connected to the output terminal of the diode 123 and the other of the source and the drain of the transistor 124. The other terminal of the coil 122 is electrically connected to one terminal of the capacitor 125 and the output terminal 131 which outputs the output voltage Vout.

The one terminal of the capacitor 125 is electrically connected to the other terminal of the coil 122 and the output terminal 131 which outputs the output voltage Vout. The power supply voltage VSS is applied to the other terminal of the capacitor 125.

Although the step-down voltage converter circuit 121 is described in FIG. 2, the voltage converter circuit 121 is not limited to the step-down voltage converter circuit; instead of the step-down voltage converter circuit, a step-up voltage converter circuit or a step-up/down voltage converter circuit may be formed, if needed.

Figure 3:
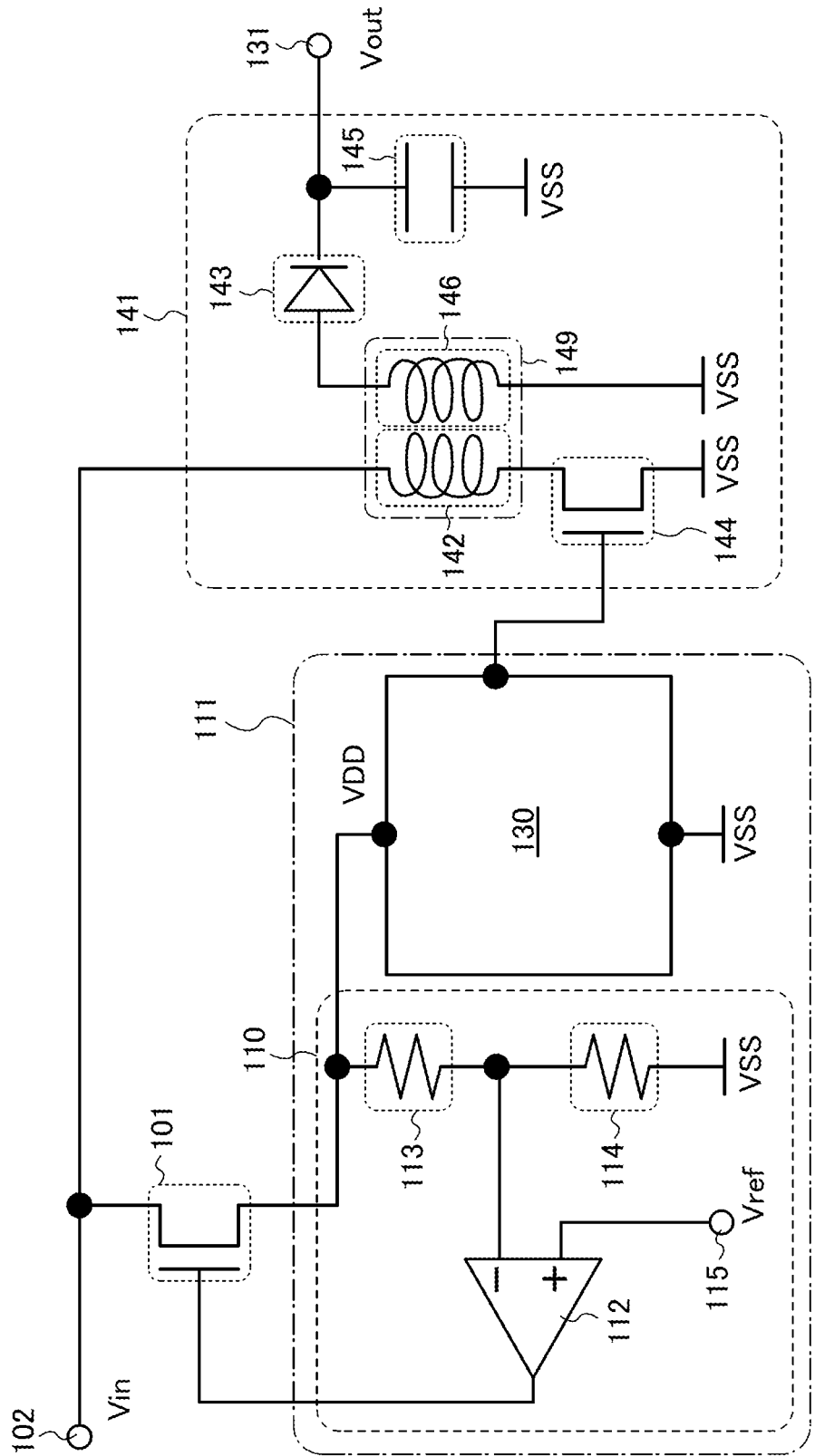
FIG. 3 is a circuit diagram of a DC-DC converter.

In FIG. 3, a DC-DC converter using a flyback voltage converter circuit will be described.

The DC-DC converter in FIG. 3 includes the control circuit 111, a voltage converter circuit 141, the input terminal 102 to which the input voltage Vin is applied, the transistor 101, and the output terminal 131 which outputs the output voltage Vout output from the voltage converter circuit 141.

The voltage converter circuit 141 in FIG. 3 includes a transformer 149 having a coil 142 and a coil 146, a transistor 144, a diode 143, and a capacitor 145.

One terminal of the coil 142 is electrically connected to the one of the source and the drain of the transistor 101 and the input terminal 102 to which the input voltage Vin is applied. The other terminal of the coil 142 is electrically connected to one of a source and a drain of the transistor 144.

The one of the source and the drain of the transistor 144 is electrically connected to the other terminal of the coil 142. The power supply voltage VSS is applied to the other of the source and the drain of the transistor 144. A gate of the transistor 144 is electrically connected to the third terminal of the internal control circuit 130.

One terminal of the coil 146 is electrically connected to an input terminal of the diode 143. The power supply voltage VSS is applied to the other terminal of the coil 146.

The input terminal of the diode 143 is electrically connected to the one terminal of the coil 146. An output terminal of the diode 143 is electrically connected to one terminal of the capacitor 145 and the output terminal 131.

The one terminal of the capacitor 145 is electrically connected to the output terminal of the diode 143 and the output terminal 131. The power supply voltage VSS is applied to the other terminal of the capacitor 145.

As described above, a DC-DC converter which is driven by the single high input voltage Vin and which includes the voltage converter circuit 141 and the control circuit 111 can be obtained.

Figure 4:
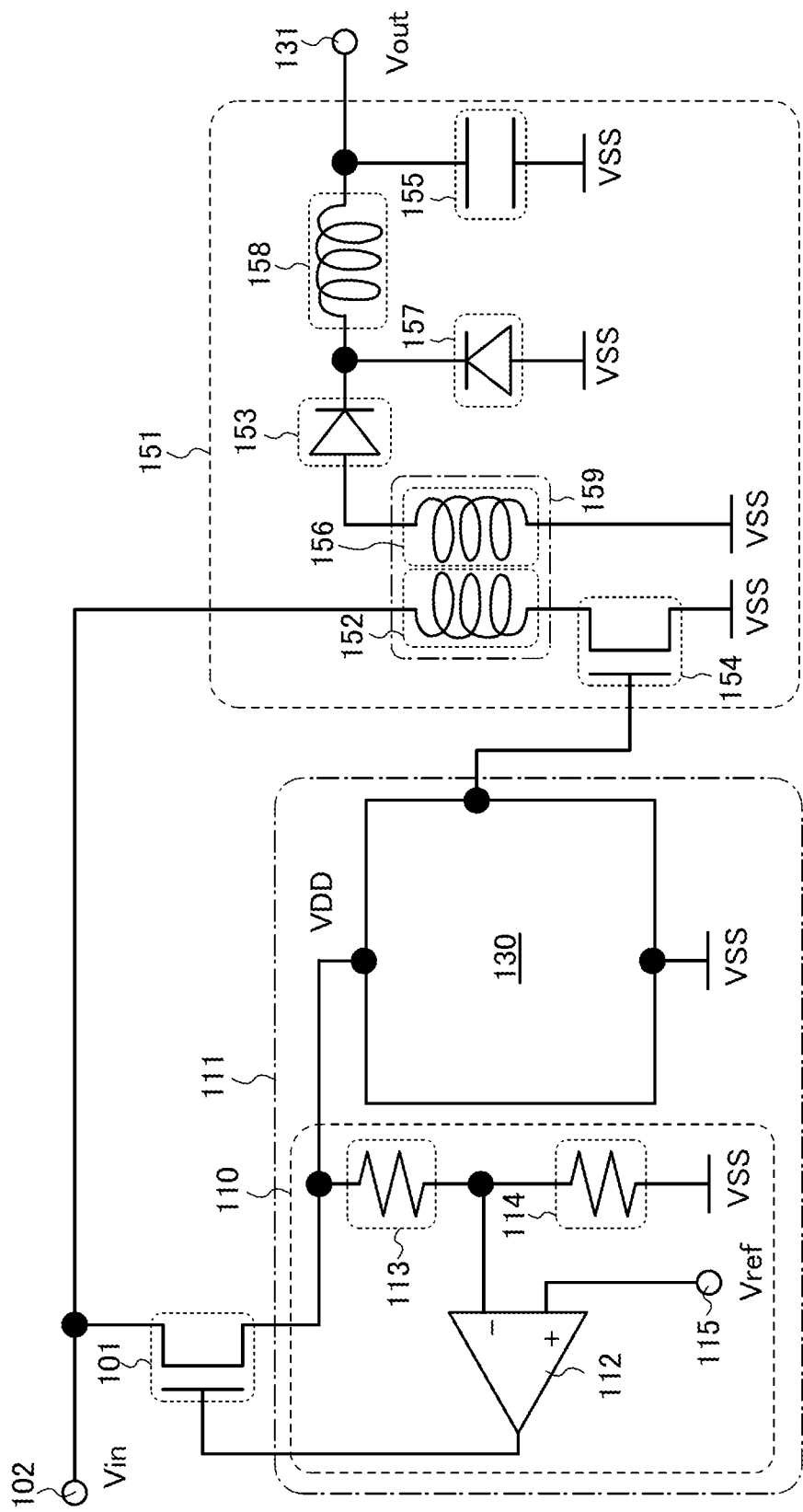
FIG. 4 is a circuit diagram of a DC-DC converter.

In FIG. 4, a DC-DC converter using a forward voltage converter circuit will be described.

The DC-DC converter in FIG. 4 includes the control circuit 111, a voltage converter circuit 151, the input terminal 102 to which the input voltage Vin is applied, the transistor 101, and the output terminal 131 which outputs the output voltage Vout output from the voltage converter circuit 151.

The voltage converter circuit 151 in FIG. 4 includes a transformer 159 having a coil 152 and a coil 156, a transistor 154, a diode 153, a diode 157, a coil 158, and a capacitor 155.

One terminal of the coil 152 is electrically connected to the one of the source and the drain of the transistor 101 and the input terminal 102 to which the input voltage Vin is applied. The other terminal of the coil 152 is electrically connected to one of a source and a drain of the transistor 154.

The one of the source and the drain of the transistor 154 is electrically connected to the other terminal of the coil 152. The power supply voltage VSS is applied to the other of the source and the drain of the transistor 154. A gate of the transistor 154 is electrically connected to the third terminal of the internal control circuit 130.

One terminal of the coil 156 is electrically connected to an input terminal of the diode 153. The power supply voltage VSS is applied to the other terminal of the coil 156.

The input terminal of the diode 153 is electrically connected to the one terminal of the coil 156. An output terminal of the diode 153 is electrically connected to an output terminal of the diode 157 and one terminal of the coil 158.

The output terminal of the diode 157 is electrically connected to the output terminal of the diode 153 and the one terminal of the coil 158. The power supply voltage VSS is applied to an input terminal of the diode 157.

The one terminal of the coil 158 is electrically connected to the output terminal of the diode 153 and the output terminal of the diode 157. The other terminal of the coil 158 is electrically connected to one terminal of the capacitor 155 and the output terminal 131.

The one terminal of the capacitor 155 is electrically connected to the other terminal of the coil 158 and the output terminal 131. The power supply voltage VSS is applied to the other terminal of the capacitor 155.

As described above, a DC-DC converter which is driven by the single high input voltage Vin and which includes the voltage converter circuit 151 and the control circuit 111 can be obtained.

<Layered Structure and Manufacturing Process Thereof>

A layered structure in which the transistors included in the operational amplifier 112 and the transistor 101 which is an oxide semiconductor transistor are stacked, and a manufacturing process of the layered structure will be described below. Note that in this embodiment, transistors including a silicon material in a channel formation region are used as the transistors included in the operational amplifier 112.

Figures 5A, 5B, 5C:
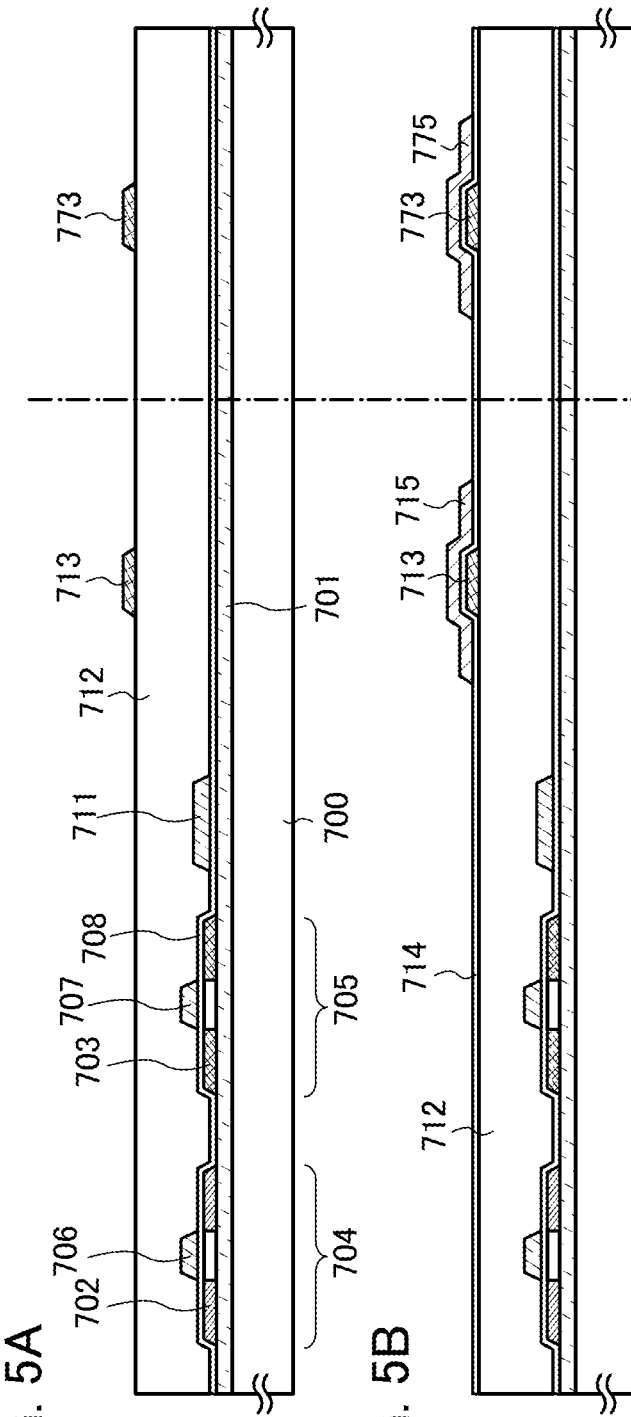
FIGS. 5A to 5C are cross-sectional views illustrating a layered structure of a transistor.

First, as illustrated in FIG. 5A, an n-channel transistor 704 and a p-channel transistor 705 are formed over an insulating surface of a substrate 700 by a known CMOS fabricating method. In this embodiment, the case where the n-channel transistor 704 and the p-channel transistor 705 are formed with a single crystal semiconductor film which is separated from a single crystal semiconductor substrate is given as an example.

Specifically, an example of a manufacturing method of the single crystal semiconductor film will be briefly described. First, an ion beam including accelerated ions is injected into the single crystal semiconductor substrate. When the ion beam is injected, a crystal structure in a region at a certain depth from the surface of the semiconductor substrate is disordered. When the crystal structure is disordered, a fragile layer which is locally weakened is formed. The depth at which the fragile layer is formed can be adjusted by the acceleration energy of the ion beam and the angle at which the ion beam enters. Then, the semiconductor substrate and the substrate 700 over which an insulating film 701 is formed are attached to each other so that the insulating film 701 is provided therebetween. After the semiconductor substrate and the substrate 700 are overlapped with each other, a pressure of, approximately, greater than or equal to 1 N/cm² and less than or equal to 500 N/cm², preferably greater than or equal to 11 N/cm² and less than or equal to 20 N/cm² is applied to part of the semiconductor substrate and the substrate 700 to attach both the substrates. When the pressure is applied, bonding between the semiconductor substrate and the insulating film 701 starts from the portion, which results in bonding of the entire surface where the semiconductor substrate and the insulating film 701 are in close contact with each other. Subsequently, heat treatment is performed, whereby very small voids that exist in the fragile layer are combined, so that the very small voids increase in volume. As a result, the single crystal semiconductor film which is part of the semiconductor substrate is separated from the semiconductor substrate along the fragile layer. The heat treatment is performed at a temperature not exceeding the strain point of the substrate 700. Then, the single crystal semiconductor film is processed into a desired shape by etching or the like, so that an island-shaped semiconductor film 702 and an island-shaped semiconductor film 703 can be formed.

The n-channel transistor 704 is formed using the island-shaped semiconductor film 702 over the insulating film 701, and the p-channel transistor 705 is formed using the island-shaped semiconductor film 703 over the insulating film 701. The n-channel transistor 704 includes a gate electrode 706, and the p-channel transistor 705 includes a gate electrode 707. The n-channel transistor 704 includes an insulating film 708 between the island-shaped semiconductor film 702 and the gate electrode 706. The p-channel transistor 705 includes the insulating film 708 between the island-shaped semiconductor film 703 and the gate electrode 707.

Although there is no particular limitation on a substrate which can be used as the substrate 700, it is necessary that the substrate have at least enough heat resistance to heat treatment performed later. For example, a glass substrate manufactured by a fusion method or a float method, a quartz substrate, a ceramic substrate, or the like can be used as the substrate 700. In the case where a glass substrate is used and the temperature of heat treatment performed later is high, a glass substrate whose strain point is higher than or equal to 730° C. is preferably used as the glass substrate. Further, a metal substrate such as a stainless-steel substrate or a substrate in which an insulating film is formed on the surface of a silicon substrate may be used as well. Although a substrate formed of a flexible synthetic resin such as plastic generally has a lower resistance temperature than the aforementioned substrates, it may be used as long as being resistant to a processing temperature during manufacturing steps.

Note that although the case where the n-channel transistor 704 and the p-channel transistor 705 are formed using the single crystal semiconductor film is described as an example in this embodiment, the present invention is not limited to this structure. For example, a polycrystalline semiconductor film which is formed over the insulating film 701 by a vapor deposition method may be used. Alternatively, the above semiconductor film may be crystallized with a known technique. As the known technique of crystallization, a laser crystallization method using a laser beam and a crystallization method using a catalytic element are given. Alternatively, a crystallization method using a catalytic element and a laser crystallization method may be combined. In the case where a heat-resistant substrate such as a quartz substrate is used, a crystallization method combined with a thermal crystallization method using an electrically heated oven, a lamp annealing crystallization method using infrared light, a crystallization method using a catalytic element, or a high-temperature annealing method at approximately 950° C., may be used. A transistor in which a channel formation region, a source region, and a drain region are formed in a single crystal silicon substrate may also be used as each of the n-channel transistor 704 and the p-channel transistor 705.

In FIG. 5A, after a conductive film is formed over the insulating film 708, the conductive film is processed into a desired shape by etching or the like, whereby a wiring 711 is formed together with the gate electrode 706 and the gate electrode 707.

Next, as illustrated in FIG. 5A, an insulating film 712 is formed so as to cover the n-channel transistor 704, the p-channel transistor 705, and the wiring 711. Note that although the case where the insulating film 712 is formed in a single layer is described as an example in this embodiment, the insulating film 712 is not necessarily a single layer and insulating films of two or more layers may be stacked as the insulating film 712.

The insulating film 712 is formed using materials which can withstand a temperature of heat treatment in a later manufacturing step. Specifically, it is preferable to use silicon oxide, silicon nitride, silicon nitride oxide, silicon oxynitride, aluminum nitride, aluminum oxide, or the like for the insulating film 712.

The insulating film 712 may have its surface planarized by a CMP method or the like.

Next, as illustrated in FIG. 5A, a gate electrode 713 of an oxide semiconductor transistor 724 and a gate electrode 773 of an oxide semiconductor transistor 781 are formed over the insulating film 712. The oxide semiconductor transistor 724 corresponds to the transistor 101 in FIG. 1, FIG. 2, FIG. 3, and FIG. 4. The oxide semiconductor transistor 781 corresponds to the transistors 124 in FIG. 1 and FIG. 2, the transistor 144 in FIG. 3, and the transistor 154 in FIG. 4.

The gate electrode 713 and the gate electrode 773 can be formed with a single-layer structure or a layered structure using a metal material such as molybdenum, titanium, chromium, tantalum, tungsten, neodymium, or scandium; a conductive film using an alloy material that contains any of these metal materials as a main component; or nitride of any of these metals. Note that aluminum or copper can also be used as such a metal material if it can withstand the temperature of heat treatment to be performed in a later process. Aluminum or copper is preferably combined with a refractory metal material so as to prevent a heat resistance problem and a corrosive problem. As the refractory metal material, molybdenum, titanium, chromium, tantalum, tungsten, neodymium, scandium, or the like can be used.

For example, as a two-layer structure of the gate electrode 713 and the gate electrode 773, the following structures are preferable: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; and a two-layer structure in which a titanium nitride film and a molybdenum film are stacked. As a three-layer structure of the gate electrode 713 and the gate electrode 773, the following structure is preferable: a layered structure containing an aluminum film, an alloy film of aluminum and silicon, an alloy film of aluminum and titanium, or an alloy film of aluminum and neodymium in a middle layer and any of a tungsten film, a tungsten nitride film, a titanium nitride film, and a titanium film in a top layer and a bottom layer.

Further, a light-transmitting oxide conductive film of indium oxide, indium oxide and tin oxide, indium oxide and zinc oxide, zinc oxide, zinc aluminum oxide, zinc aluminum oxynitride, zinc gallium oxide, or the like can also be used as the gate electrode 713 and the gate electrode 773.

The thickness of each of the gate electrode 713 and the gate electrode 773 is in the range of 10 nm to 400 nm, preferably 100 nm to 200 nm. In this embodiment, after a conductive film for the gate electrode is formed to have a thickness of 150 nm by a sputtering method using a tungsten target, the conductive film is processed (patterned) into a desired shape by etching, whereby the gate electrode 713 and the gate electrode 773 are formed. Note that when end portions of the formed gate electrodes are tapered, coverage with a gate insulating film stacked thereover is improved, which is preferable. Note that a resist mask may be formed by an inkjet method. Formation of the resist mask by an inkjet method needs no photomask; thus, manufacturing cost can be reduced.

Next, as illustrated in FIG. 5B, a gate insulating film 714 is formed over the gate electrode 713 and the gate electrode 773. The gate insulating film 714 can be formed to have a single-layer structure or a layered structure using one or more selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film by a plasma enhanced CVD method, a sputtering method, or the like. It is preferable that the gate insulating film 714 contain as little impurities such as moisture, hydrogen, or oxygen as possible. In the case of forming a silicon oxide film by a sputtering method, a silicon target or a quartz target is used as a target, and oxygen or a mixed gas of oxygen and argon is used as a sputtering gas.

An oxide semiconductor that is made to be i-type (a highly purified oxide semiconductor) by removal of impurities is extremely sensitive to interface state density and interface electric charge; thus, an interface between the highly purified oxide semiconductor and the gate insulating film 714 is important. Therefore, the gate insulating film that is in contact with the highly-purified oxide semiconductor needs to have higher quality.

For example, a high-density plasma enhanced CVD using a microwave (frequency: 2.45 GHz) is preferably used, in which case an insulating film which is dense, has high breakdown voltage, and is of high quality can be formed. This is because when the highly purified oxide semiconductor is closely in contact with the high-quality gate insulating film, the interface state can be reduced and interface properties can be favorable.

Needless to say, a different film formation method such as a sputtering method or a plasma enhanced CVD method can be used as long as a high-quality insulating film can be formed as the gate insulating film 714. In addition, any insulating film can be used as long as film quality and characteristics of an interface with an oxide semiconductor are modified by heat treatment performed after deposition. In any case, any insulating film can be used as long as film quality as a gate insulating film is high, interface state density between the gate insulating film and an oxide semiconductor is decreased, and a favorable interface can be formed.

The gate insulating film 714 may be formed to have a structure in which an insulating film formed using a material having a high barrier property and an insulating film having lower proportion of nitrogen, such as a silicon oxide film or a silicon oxynitride film, are stacked. In this case, the insulating film such as a silicon oxide film or a silicon oxynitride film is formed between the insulating film having a high barrier property and the oxide semiconductor film. As the insulating film having a high barrier property, a silicon nitride film, a silicon nitride oxide film, an aluminum nitride film, an aluminum nitride oxide film, or the like can be given, for example. The insulating film having a high barrier property is used, so that impurities in an atmosphere, such as moisture or hydrogen, or impurities in the substrate, such as an alkali metal or a heavy metal, can be prevented from entering the oxide semiconductor film, the gate insulating film 714, or the interface between the oxide semiconductor film and another insulating film and the vicinity thereof. In addition, the insulating film having lower proportion of nitrogen such as a silicon oxide film or a silicon oxynitride film is formed so as to be in contact with the oxide semiconductor film, so that the insulating film having a high barrier property can be prevented from being in contact with the oxide semiconductor film directly.

For example, a silicon nitride film ($SiN_y$ (y>0)) with a thickness of greater than or equal to 50 nm and less than or equal to 200 nm is formed by a sputtering method as a first gate insulating film, and a silicon oxide film ($SiO_x$ (x>0)) with a thickness of greater than or equal to 5 nm and less than or equal to 300 nm is stacked over the first gate insulating film as a second gate insulating film; thus, these films may be used as the gate insulating film 714 having a thickness of 100 nm. The thickness of the gate insulating film 714 may be set as appropriate depending on characteristics needed for the transistors and may be approximately 350 nm to 400 nm.

In this embodiment, the gate insulating film 714 having a structure in which a silicon oxide film having a thickness of 100 nm formed by a sputtering method is stacked over a silicon nitride film having a thickness of 50 nm formed by a sputtering method is formed.

Note that the gate insulating film 714 is in contact with the oxide semiconductor film to be formed later. Hydrogen contained in the oxide semiconductor film adversely affects characteristics of the transistor; therefore, it is preferable that the gate insulating film 714 do not contain hydrogen, a hydroxyl group, and moisture. In order that the gate insulating film 714 contains as little hydrogen, a hydroxyl group, and moisture as possible, it is preferable that an impurity adsorbed on the substrate 700, such as moisture or hydrogen, be eliminated and removed by preheating the substrate 700, over which the gate electrode 713 and the gate electrode 773 are formed, in a preheating chamber of a sputtering apparatus, as a pretreatment for film formation. The temperature for the preheating is higher than or equal to 100° C. and lower than or equal to 400° C., preferably, higher than or equal to 150° C. and lower than or equal to 300° C. As an exhaustion unit provided in the preheating chamber, a cryopump is preferable. Note that this preheating treatment can be omitted.

Next, over the gate insulating film 714, an oxide semiconductor film having a thickness of greater than or equal to 2 nm and less than or equal to 200 nm, preferably greater than or equal to 3 nm and less than or equal to 50 nm, or more preferably greater than or equal to 3 nm and less than or equal to 20 nm is formed. Channel formation regions of the oxide semiconductor transistor 724 and the oxide semiconductor transistor 781 are formed in the oxide semiconductor film. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is formed by a sputtering method, dust attached to a surface of the gate insulating film 714 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

As described above, as a material of the oxide semiconductor film, the following oxide semiconductors can also be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor which are two-component metal oxides; an In—O-based oxide semiconductor, a Sn—O-based oxide semiconductor, and a Zn—O-based oxide semiconductor which are one-component metal oxides.

In this embodiment, as the oxide semiconductor film, an In—Ga—Zn—O-based oxide semiconductor thin film with a thickness of 30 nm, which is obtained by a sputtering method using a target including indium (In), gallium (Ga), and zinc (Zn), is used. As the target, a target having a composition ratio in which $In_2O_3:Ga_2O_3:ZnO=1:1:0.5$ (molar ratio), a target having a composition ratio in which $In_2O_3:Ga_2O_3:ZnO=1:1:1$ (molar ratio), or a target having a composition ratio in which $In_2O_3:Ga_2O_3:ZnO=1:1:2$ (molar ratio) can be used. The filling rate of the target including In, Ga, and Zn is 90% or higher and 100% or lower, and preferably 95% or higher and lower than 100%. With the use of the target with high filling rate, a dense oxide semiconductor film is formed.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

In this embodiment, the oxide semiconductor film is formed over the substrate 700 in such a manner that the substrate is held in the treatment chamber kept at reduced pressure, a sputtering gas from which hydrogen and moisture have been removed is introduced into the treatment chamber while remaining moisture therein is removed, and the above target is used. The substrate temperature may be higher than or equal to 100° C. and lower than or equal to 600° C., preferably higher than or equal to 200° C. and lower than or equal to 400° C. in film formation. By forming the oxide semiconductor film in a state where the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of impurities included in the oxide semiconductor film formed in the deposition chamber can be reduced.

Moreover, when the leakage rate of the treatment chamber of the sputtering apparatus is set to lower than or equal to $1 \times 10^{-10}$ Pa·m$^3$/second, entry of impurities such as an alkali metal or hydride into the oxide semiconductor film that is being formed by a sputtering method can be reduced. Further, with the use of an entrapment vacuum pump as an evacuation system, counter flow of impurities such as an alkali metal, a hydrogen atom, a hydrogen molecule, water, a hydroxyl group, or hydride from the evacuation system can be reduced.

As a sputtering as, a rare gas (typically argon), oxygen, or a mixed gas of a rare gas and oxygen is used as appropriate. It is preferable that a high-purity gas from which impurities such as hydrogen, water, a hydroxyl group, and hydride are removed be used as a sputtering gas.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power supply is preferable because dust generated in deposition can be reduced and the film thickness can be made uniform.

In order that the oxide semiconductor film contains as little hydrogen, a hydroxyl group, and moisture as possible, it is preferable that an impurity adsorbed on the substrate 700, such as moisture or hydrogen, be eliminated and removed by preheating the substrate 700, over which films up to the gate insulating film 714 are formed, in a preheating chamber of a sputtering apparatus, as a pretreatment for film formation. The temperature for the preheating is higher than or equal to 100° C. and lower than or equal to 400° C., preferably, higher than or equal to 150° C. and lower than or equal to 300° C. As an exhaustion unit provided in the preheating chamber, a cryopump is preferable. Note that this preheating treatment can be omitted. This preheating may be similarly performed on the substrate 700 over which films up to and including an electrode 716, an electrode 717, an electrode 718, an electrode 719, an electrode 720, an electrode 779, and an electrode 780 are formed before the formation of an insulating film 723 which will be formed later.

Next, as illustrated in FIG. 5B, the oxide semiconductor film is processed (patterned) into a desired shape by etching or the like, whereby an island-shaped oxide semiconductor film 715 is formed over the gate insulating film 714 in a position where the island-shaped oxide semiconductor film 715 overlaps with the gate electrode 713 and an island-shaped oxide semiconductor film 775 is formed over the gate insulating film 714 in a position where the island-shaped oxide semiconductor film 775 overlaps with the gate electrode 773.

A resist mask for forming the island-shaped oxide semiconductor film 715 and the island-shaped oxide semiconductor film 775 may be formed by an ink-jet method. Formation of the resist mask by an inkjet method needs no photomask; thus, manufacturing cost can be reduced.

Note that etching for forming the island-shaped oxide semiconductor film 715 and the island-shaped oxide semiconductor film 775 may be wet etching, dry etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate reactive ion etching (RIE) method or an inductively coupled plasma (ICP) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, ITO-07N (produced by KANTO CHEMICAL CO., INC.) may be used. The etchant after the wet etching is removed together with the etched materials by cleaning. The waste liquid including the etchant and the material etched off may be purified and the material may be reused. When a material such as indium included in the oxide semiconductor films is collected from the waste liquid after the etching and reused, the resources can be efficiently used and the cost can be reduced.

Note that it is preferable that reverse sputtering be performed before the formation of a conductive film in a subsequent step so that a resist residue or the like that is attached to surfaces of the oxide semiconductor film 715, the oxide semiconductor film 775, and the gate insulating film 714 is removed.

Note that, in some cases, the oxide semiconductor films formed by sputtering or the like include a large amount of moisture or hydrogen as impurities. Moisture and hydrogen easily form a donor level and thus serve as impurities in the oxide semiconductor. Therefore, in one embodiment of the present invention, heat treatment is performed on the oxide semiconductor film 715 and the oxide semiconductor film 775 in an atmosphere of nitrogen, oxygen, ultra-dry air, or a rare gas (argon, helium, or the like) in order to reduce impurities such as moisture or hydrogen in the oxide semiconductor films. It is desirable that the content of water in the gas be 20 ppm or less, preferably 1 ppm or less, and more preferably 10 ppb or less.

Heat treatment performed on the oxide semiconductor film 715 and the oxide semiconductor film 775 can eliminate moisture or hydrogen in the oxide semiconductor film 715 and the oxide semiconductor film 775. Specifically, heat treatment may be performed at higher than or equal to 300° C. and lower than or equal to 700° C., preferably higher than or equal to 300° C. and lower than or equal to 500° C. For example, heat treatment may be performed at 500° C. for approximately greater than or equal to three minutes and less than or equal to six minutes. When an RTA method is used for the heat treatment, dehydration or dehydrogenation can be performed in a short time; therefore, treatment can be performed even at a temperature higher than the strain point of a glass substrate.

In this embodiment, an electrical furnace that is one of heat treatment apparatuses is used.

Note that a heat treatment apparatus is not limited to an electrical furnace, and may include a device for heating an object to be processed by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

Note that it is preferable that in the heat treatment, moisture, hydrogen, or the like be not contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

Through the above-described steps, the concentration of hydrogen in the oxide semiconductor film 715 and the oxide semiconductor film 775 can be reduced and the oxide semiconductor film 715 and the oxide semiconductor film 775 can be highly purified. Thus, the oxide semiconductor films can be stabilized. In addition, heat treatment at a temperature of lower than or equal to the glass transition temperature makes it possible to form an oxide semiconductor film with a wide band gap in which carrier density is extremely low. Therefore, the transistor can be manufactured using a large-sized substrate, so that the productivity can be increased. In addition, by using the oxide semiconductor film in which the hydrogen concentration is reduced and purity is improved, it is possible to manufacture a transistor with high breakdown voltage and a high on-off ratio.

Note that in the case where the oxide semiconductor films are heated, although depending on materials or heating conditions of the oxide semiconductor films, in some cases, the entire layer is not amorphous and crystals are formed at the surfaces of the oxide semiconductor films. The oxide semiconductor films preferably have non-single-crystals in which crystals that are c-axis-oriented in a direction substantially perpendicular to the surfaces of the oxide semiconductor films.

Next, the insulating film 708, the insulating film 712, and the gate insulating film 714 are partly etched, whereby contact holes reaching the island-shaped semiconductor film 702, the island-shaped semiconductor film 703, and the wiring 711 are formed.

Then, a conductive film is formed so as to cover the oxide semiconductor film 715 and the oxide semiconductor film 775 by a sputtering method or a vacuum evaporation method. After that, the conductive film is processed by etching or the like, so that the electrodes 716 to 720, the electrode 779, and the electrode 780 each of which functions as a source electrode, a drain electrode, or a wiring are formed as illustrated in FIG. 5C.

Note that the electrode 716 and the electrode 717 are in contact with the island-shaped semiconductor film 702. The electrode 717 and the electrode 718 are in contact with the island-shaped semiconductor film 703. The electrode 719 is in contact with the wiring 711 and the oxide semiconductor film 715. The electrode 720 is in contact with the oxide semiconductor film 715. Note that the electrode 779 and the electrode 780 are in contact with the oxide semiconductor film 775.

As a material of the conductive film for forming the electrodes 716 to 720, the electrode 779, and the electrode 780, any of the following materials can be used, for example: an element selected from aluminum, chromium, copper, tantalum, titanium, molybdenum, or tungsten; an alloy containing any of these elements; and an alloy film containing the above elements in combination. Alternatively, a structure may be employed in which a film of a refractory metal such as chromium, tantalum, titanium, molybdenum, or tungsten is stacked over or below a metal film of aluminum or copper. Aluminum or copper is preferably combined with a refractory metal material so as to prevent a heat resistance problem and a corrosion problem. As the refractory metal material, molybdenum, titanium, chromium, tantalum, tungsten, neodymium, scandium, yttrium, or the like can be used.

Further, the conductive film may have a single-layer structure or a layered structure of two or more layers. For example, a single-layer structure of an aluminum film containing silicon; a two-layer structure of an aluminum film and a titanium film stacked thereover; a three-layer structure in which a titanium film, an aluminum film, and a titanium film are stacked in that order; and the like can be given.

The conductive film for forming the electrodes 716 to 720, the electrode 779, and the electrode 780 may be formed using a conductive metal oxide. As a conductive metal oxide, indium oxide, tin oxide, zinc oxide, indium oxide and tin oxide, indium oxide and zinc oxide, or the metal oxide material to which silicon or silicon oxide is added can be used.

In the case where heat treatment is performed after formation of the conductive film, the conductive film preferably has heat resistance enough to withstand the heat treatment.

Note that each material and etching conditions are adjusted as appropriate so that the oxide semiconductor film 715 and the oxide semiconductor film 775 are not removed in etching of the conductive film as much as possible. Depending on the etching conditions, there are some cases in which an exposed portion of each of the island-shaped oxide semiconductor film 715 and the island-shaped oxide semiconductor film 775 is partly etched and thus a groove (a depression portion) is formed.

In this embodiment, a titanium film is used for the conductive film. Therefore, wet etching can be selectively performed on the conductive film using a solution (an ammonia hydrogen peroxide mixture) containing ammonia and hydrogen peroxide water. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Next, plasma treatment is performed using a gas such as $N_2O$, $N_2$, or Ar. By the plasma treatment, water or the like which attaches or is adsorbed to an exposed surfaces of the oxide semiconductor films is removed. Plasma treatment may be performed using a mixed gas of oxygen and argon as well.

After the plasma treatment, as illustrated in FIG. 6A, the insulating film 723 is formed so as to cover the electrodes 716 to 720, the electrode 779, the electrode 780, the oxide semiconductor film 715, and the oxide semiconductor film 775. The insulating film 723 preferably contains as little impurities such as moisture, hydrogen, and oxygen as possible. An insulating film of a single layer or a plurality of insulating films stacked may be employed for the insulating film 723. When hydrogen is contained in the insulating film 723, entry of the hydrogen to the oxide semiconductor films or extraction of oxygen in the oxide semiconductor films by the hydrogen occurs, whereby a back channel portion of each of the oxide semiconductor films has lower resistance (n-type conductivity); thus, a parasitic channel might be formed. Therefore, it is important that a film formation method in which hydrogen is not used be employed in order to form the insulating film 723 containing as little hydrogen as possible. A material having a high barrier property is preferably used for the insulating film 723. For example, as the insulating film having a high barrier property, a silicon nitride film, a silicon nitride oxide film, an aluminum nitride film, an aluminum nitride oxide film, or the like can be used.

When a plurality of insulating films stacked is used as the insulating film 723, an insulating film having lower proportion of nitrogen, such as a silicon oxide film or a silicon oxynitride film, is formed on the side closer to the oxide semiconductor film 715 and the oxide semiconductor film 775 than the insulating film having a high barrier property. Then, the insulating film having a high barrier property is formed so as to overlap with the electrodes 716 to 720, the electrode 779, the electrode 780, the oxide semiconductor film 715, and the oxide semiconductor film 775 with the insulating film having lower proportion of nitrogen provided between the insulating film having a barrier property, and the electrodes 716 to 720, the electrode 779, the electrode 780, the oxide semiconductor film 715, and the oxide semiconductor film 775. By using the insulating film having a high barrier property, the impurities such as moisture or hydrogen can be prevented from entering the oxide semiconductor film 715, the oxide semiconductor film 775, the gate insulating film 714, the interface between the oxide semiconductor film 715 and another insulating film and the vicinity thereof, or the interface between the oxide semiconductor film 775 and another insulating film and the vicinity thereof. In addition, the insulating film having low proportion of nitrogen, such as a silicon oxynitride film formed in contact with the oxide semiconductor film 715 and the oxide semiconductor film 775 can prevent the insulating film formed using a material having a high barrier property from being in direct contact with the oxide semiconductor film 715 and the oxide semiconductor film 775.

In this embodiment, the insulating film 723 having a structure in which a silicon nitride film having a thickness of 100 nm formed by a sputtering method is stacked over a silicon oxide film having a thickness of 200 nm formed by a sputtering method is formed. The substrate temperature in film formation may be higher than or equal to room temperature and lower than or equal to 300° C. and in this embodiment, is 100° C.

After the insulating film 723 is formed, heat treatment may be performed. The heat treatment is performed under a nitrogen atmosphere, an ultra-dry air atmosphere, or a rare gas (e.g., argon and helium) atmosphere at preferably a temperature higher than or equal to 200° C. and lower than or equal to 400° C., for example, higher than or equal to 250° C. and lower than or equal to 350° C. It is desirable that the content of water in the gas be 20 ppm or less, preferably 1 ppm or less, and more preferably 10 ppb or less. In this embodiment, for example, heat treatment is performed at 250° C. in a nitrogen atmosphere for 1 hour. Alternatively, RTA treatment for a short time at a high temperature may be performed before the formation of the electrodes 716 to 720, the electrode 779, and the electrode 780 in a manner similar to that of the previous heat treatment performed on the oxide semiconductor films for reduction of moisture or hydrogen. Even when oxygen defects are generated in the oxide semiconductor film 715 and the oxide semiconductor film 775 because of the previous heat treatment performed on the oxide semiconductor films, by performing heat treatment after the insulating film 723 containing oxygen is provided, oxygen is supplied to the oxide semiconductor film 715 and the oxide semiconductor film 775 from the insulating film 723. A structure can be provided in which, by supplying oxygen to the oxide semiconductor film 715 and the oxide semiconductor film 775, oxygen defects serving as donors are reduced in the oxide semiconductor film 715 and the oxide semiconductor film 775 so that oxygen is contained to satisfy the stoichiometric proportion or to be greater than or equal to the stoichiometric proportion. It is preferable that the proportion of oxygen in the oxide semiconductor film 715 and the oxide semiconductor film 775 be higher than that in the stoichiometric proportion. As a result, the oxide semiconductor film 715 and the oxide semiconductor film 775 can be made to be substantially i-type and variation in electrical characteristics of the transistors due to oxygen defects can be reduced; thus, the electrical characteristics can be improved. The timing of this heat treatment is not particularly limited as long as it is after the formation of the insulating film 723. When this heat treatment also serves as heat treatment in another step (e.g., heat treatment at the time of formation of a resin film or heat treatment for reducing the resistance of a transparent conductive film), the oxide semiconductor film 715 and the oxide semiconductor film 775 can be or substantially i-type without an increase in the number of steps.

Moreover, the oxygen defects that serve as donors in the oxide semiconductor film 715 and the oxide semiconductor film 775 may be reduced by subjecting the oxide semiconductor film 715 and the oxide semiconductor film 775 to heat treatment under an oxygen atmosphere so that oxygen is added to the oxide semiconductor. The heat treatment is performed at a temperature, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more preferably greater than or equal to 7N (99.99999%) (that is, the impurity concentration in the oxygen is less than or equal to 1 ppm, or preferably less than or equal to 0.1 ppm).

Alternatively, an ion implantation method, an ion doping method, or the like may be employed to add oxygen to the oxide semiconductor film 715 and the oxide semiconductor film 775 so that oxygen defects as donors are reduced. For example, oxygen made to be plasma with a microwave of 2.45 GHz may be added to the oxide semiconductor film 715 and the oxide semiconductor film 775.

Through the above steps, the oxide semiconductor transistor 724 and the oxide semiconductor transistor 781 are formed.

The oxide semiconductor transistor 724 includes the gate electrode 713, the gate insulating film 714 over the gate electrode 713, the oxide semiconductor film 715 which is over the gate insulating film 714 and overlaps with the gate electrode 713, a pair of the electrode 719 and the electrode 720 formed over the oxide semiconductor film 715, and the insulating film 723 which is formed over the oxide semiconductor film 715.

Similarly, the oxide semiconductor transistor 781 includes the gate electrode 773, the gate insulating film 714 over the gate electrode 773, the oxide semiconductor film 775 which is over the gate insulating film 714 and overlaps with the gate electrode 773, a pair of the electrode 779 and the electrode 780 formed over the oxide semiconductor film 775, and the insulating film 723 which is formed over the oxide semiconductor film 775.

Note that the oxide semiconductor transistor 724 in FIG. 6A has a channel-etched structure in which part of the oxide semiconductor film 715 is etched between the electrode 719 and the electrode 720. Similarly, the oxide semiconductor transistor 781 in FIG. 6A has a channel-etched structure in which part of the oxide semiconductor film 775 is etched between the electrode 779 and the electrode 780.

Although description is given using single-gate transistors as the oxide semiconductor transistor 724 and the oxide semiconductor transistor 781, a multi-gate transistor including a plurality of channel formation regions by including a plurality of the gate electrodes that are electrically connected to each other may be formed as needed.

The n-channel transistor 704 and the p-channel transistor 705 illustrated in FIG. 6A can be used as the transistors included in the operational amplifiers 112 illustrated in FIG. 2, FIG. 3, and FIG. 4. The oxide semiconductor transistor 724 illustrated in FIG. 6A can be used as the transistors 101 illustrated in FIG. 1, FIG. 2, FIG. 3, and FIG. 4. The oxide semiconductor transistor 781 illustrated in FIG. 6A can be used as the transistors 124 in FIG. 1 and FIG. 2, the transistor 144 in FIG. 3, and the transistor 154 in FIG. 4.

Accordingly, the transistors included in the operational amplifier 112, the transistor 101 which is an oxide semiconductor transistor, and the transistor of the voltage converter circuit (the transistor 124, the transistor 144, or the transistor 154) can be stacked over the substrate 700 with the insulating film 712 interposed between the transistors included in the operational amplifier 112 and the transistor 101 and the transistor of the voltage converter circuit. Thus, the increase of the occupied area of the DC-DC converter can be suppressed.

In addition, the transistor 101 which is an oxide semiconductor transistor and the transistor of the voltage converter circuit (the transistor 124, the transistor 144, or the transistor 154) can be formed in the same manufacturing process; therefore, the number of manufacturing steps and a manufacture cost can be reduced.

A layered structure which is different from that in FIG. 6A will be illustrated in FIG. 6B.

FIG. 6B illustrates the n-channel transistor 704 and the p-channel transistor 705. Further, in FIG. 6B, a bottom-gate oxide semiconductor transistor 725 and a bottom-gate oxide semiconductor transistor 751 which have channel protective structures using an oxide semiconductor film are formed over the n-channel transistor 704 and the p-channel transistor 705.

The oxide semiconductor transistor 725 includes a gate electrode 730 which is formed over the insulating film 712, a gate insulating film 731 which is over the gate electrode 730, an island-shaped oxide semiconductor film 732 which overlaps with the gate electrode 730 and which is over the gate insulating film 731, a channel protective film 733 which overlaps with the gate electrode 730 and which is over the island-shaped oxide semiconductor film 732, an electrode 734 and an electrode 735 which are formed over the oxide semiconductor film 732, and an insulating film 736 which is formed over the electrode 734, the electrode 735, and the channel protective film 733.

The oxide semiconductor transistor 751 includes a gate electrode 750 which is formed over the insulating film 712, the gate insulating film 731 which is over the gate electrode 750, an island-shaped oxide semiconductor film 752 which overlaps with the gate electrode 750 and which is over the gate insulating film 731, a channel protective film 753 which overlaps with the gate electrode 750 and which is over the island-shaped oxide semiconductor film 752, an electrode 754 and an electrode 755 which are formed over the oxide semiconductor film 752, and the insulating film 736 which is formed over the electrode 754, the electrode 755, and the channel protective film 753.

The channel protective film 733 and the channel protective film 753 can prevent a portion of the oxide semiconductor film 732 and the oxide semiconductor film 752, which each serves as a channel formation region, from being damaged in a later step, for example, reduction in thickness due to plasma or an etchant in etching. Therefore, reliability of the transistors can be improved.

An inorganic material containing oxygen (silicon oxide, silicon nitride oxide, silicon oxynitride, aluminum oxide, aluminum oxynitride, or the like) can be used for the channel protective film 733 and the channel protective film 753. The channel protective film 733 and the channel protective film 753 can be formed by a vapor deposition method such as a plasma enhanced CVD method or a thermal CVD method, or a sputtering method. After the formation of the channel protective film 733 and the channel protective film 753, the shapes thereof are processed by etching. Here, the channel protective film 733 and the channel protective film 753 are formed in such a manner that a silicon oxide film is formed by a sputtering method and processed by etching using a mask formed by photolithography.

An inorganic material containing oxygen is used for the channel protective film 733 and the channel protective film 753, whereby a structure can be provided in which oxygen is supplied from the channel protective film 733 to the oxide semiconductor film 732 and oxygen is supplied from the channel protective film 753 to the oxide semiconductor film 752 and oxygen defects serving as donors are reduced so that oxygen is contained to satisfy the stoichiometric proportion or to be greater than or equal to the stoichiometric proportion even when the oxygen defects are generated in the oxide semiconductor film 732 and the oxide semiconductor film 752 by heat treatment performed to reduce moisture or hydrogen. The oxide semiconductor film 732 and the oxide semiconductor film 752 preferably contain oxygen whose composition exceeds the stoichiometric composition. Thus, the channel formation region can be made to be close to i-type. The channel formation region can be made to be close to i-type, so that a variation in electrical characteristics of the oxide semiconductor transistor 725 and the oxide semiconductor transistor 751 due to oxygen defects can be reduced; accordingly, the electrical characteristics can be improved.

The n-channel transistor 704 and the p-channel transistor 705 illustrated in FIG. 6B can be used as the transistors included in the operational amplifiers 112 illustrated in FIG. 2, FIG. 3, and FIG. 4. The oxide semiconductor transistor 725 illustrated in FIG. 6B can be used as the transistors 101 illustrated in FIG. 1, FIG. 2, FIG. 3, and FIG. 4. The oxide semiconductor transistor 751 illustrated in FIG. 6B can be used as the transistors 124 in FIG. 1 and FIG. 2, the transistor 144 in FIG. 3, and the transistor 154 in FIG. 4.

Accordingly, the transistors included in the operational amplifier 112, the transistor 101 which is an oxide semiconductor transistor, and the transistor of the voltage converter circuit (the transistor 124, the transistor 144, or the transistor 154) can be stacked over the substrate 700 with the insulating film 712 interposed between the transistors included in the operational amplifier 112 and the transistor 101 and the transistor of the voltage converter circuit. Thus, the increase of the occupied area of the DC-DC converter can be suppressed.

In addition, the transistor 101 which is an oxide semiconductor transistor and the transistor of the voltage converter circuit (the transistor 124, the transistor 144, or the transistor 154) can be formed in the same manufacturing process; therefore, the number of manufacturing steps and a manufacture cost can be reduced.

FIG. 6C illustrates the n-channel transistor 704 and the p-channel transistor 705. In addition, a bottom-contact oxide semiconductor transistor 726 and a bottom-contact oxide semiconductor transistor 760 including an oxide semiconductor film are formed over the n-channel transistor 704 and the p-channel transistor 705 in FIG. 6C.

The oxide semiconductor transistor 726 includes a gate electrode 741 which is formed over the insulating film 712, a gate insulating film 742 which is over the gate electrode 741, an electrode 743 and an electrode 744 which are over the gate insulating film 742, an oxide semiconductor film 745 which overlaps with the gate electrode 741 with the gate insulating film 742 therebetween, and an insulating film 746 which is formed over the oxide semiconductor film 745.

The oxide semiconductor transistor 760 includes a gate electrode 761 which is formed over the insulating film 712, the gate insulating film 742 which is over the gate electrode 761, an electrode 763 and an electrode 764 which are over the gate insulating film 742, an oxide semiconductor film 765 which overlaps with the gate electrode 761 with the gate insulating film 742 therebetween, and the insulating film 746 which is formed over the oxide semiconductor film 765.

The n-channel transistor 704 and the p-channel transistor 705 illustrated in FIG. 6C can be used as the transistors included in the operational amplifiers 112 illustrated in FIG. 2, FIG. 3, and FIG. 4. The oxide semiconductor transistor 726 illustrated in FIG. 6C can be used as the transistors 101 illustrated in FIG. 1, FIG. 2, FIG. 3, and FIG. 4. The oxide semiconductor transistor 760 illustrated in FIG. 6C can be used as the transistors 124 in FIG. 1 and FIG. 2, the transistor 144 in FIG. 3, and the transistor 154 in FIG. 4.

Accordingly, the transistors included in the operational amplifier 112, the transistor 101 which is an oxide semiconductor transistor, and the transistor of the voltage converter circuit (the transistor 124, the transistor 144, or the transistor 154) can be stacked over the substrate 700 with the insulating film 712 interposed between the transistors included in the operational amplifier 112 and the transistor 101 and the transistor of the voltage converter circuit. Thus, the increase of the occupied area of the DC-DC converter can be suppressed.

In addition, the transistor 101 which is an oxide semiconductor transistor and the transistor of the voltage converter circuit (the transistor 124, the transistor 144, or the transistor 154) can be formed in the same manufacturing process; therefore, the number of manufacturing steps and a manufacture cost can be reduced.

This application is based on Japanese Patent Application serial no. 2010-270316 filed with Japan Patent Office on Dec. 3, 2010, the entire contents of which are hereby incorporated by reference.

What is claimed is:

1. A DC-DC converter comprising:
an input terminal to which input voltage is applied;
a voltage converter circuit that is connected to the input terminal and includes a first transistor;
a control circuit that is configured to control the voltage converter circuit and includes a second transistor including a silicon film in a channel formation region; and
a third transistor that is provided between the input terminal and the control circuit and configured to convert the input voltage into power supply voltage that is lower than the input voltage,
wherein the first transistor and the third transistor are transistors including an oxide semiconductor film in channel formation regions,
wherein the oxide semiconductor films of the first transistor and the third transistor are stacked over the silicon film of the second transistor with an insulating film provided between the oxide semiconductor films of the first and third transistors and the silicon film of the second transistor, and
wherein the third transistor is configured to supply the power supply voltage to the control circuit from one of a source and a drain of the third transistor.

2. The DC-DC converter according to claim 1, wherein the oxide semiconductor films of the first transistor and the third transistor each comprise any one of an In—Sn—Ga—Zn—O-based oxide semiconductor, an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, an In—O-based oxide semiconductor, a Sn—O-based oxide semiconductor, and a Zn—O-based oxide semiconductor.

3. The DC-DC converter according to claim 1, wherein the voltage converter circuit is a step-down voltage converter circuit.

4. The DC-DC converter according to claim 1, wherein the voltage converter circuit is a flyback voltage converter circuit.

5. The DC-DC converter according to claim 1, wherein the voltage converter circuit is a forward voltage converter circuit.

6. The DC-DC converter according to claim 1, wherein a gate of the third transistor is electrically connected to the control circuit.

7. The DC-DC converter according to claim 1, wherein a gate of the third transistor is directly connected to an output terminal of an operational amplifier included in the control circuit.

8. The DC-DC converter according to claim 1,
wherein the one of the source and the drain of the third transistor is electrically connected to the control circuit, and
wherein the other of the source and the drain of the third transistor is electrically connected to the input terminal.

9. The DC-DC converter according to claim 1,
wherein a gate of the third transistor is directly connected to an output terminal of an operational amplifier included in the control circuit, and
wherein the other of the source and the drain of the third transistor is directly connected to both the input terminal and one of a source and a drain of the first transistor.

10. A method for manufacturing a DC-DC converter, comprising the steps of:
forming a second transistor using a silicon film in a second channel formation region, over an insulating surface;
forming an insulating film covering the second transistor; and
forming a first transistor including an oxide semiconductor film in a first channel formation region and a third transistor using the oxide semiconductor film in a third channel formation region over the insulating film,
wherein a voltage converter circuit includes the first transistor,
wherein a control circuit configured to control the voltage converter circuit includes the second transistor,
wherein the third transistor is provided between an input terminal and the control circuit, and converts input voltage applied to the input terminal into power supply voltage that is lower than the input voltage,
wherein the oxide semiconductor films of the first transistor and the third transistor are stacked over the silicon film of the second transistor with the insulating film provided between the oxide semiconductor films of the first and third transistors and the silicon film of the second transistor, and
wherein the third transistor is configured to supply the power supply voltage to the control circuit from one of a source and a drain of the third transistor.

11. The method for manufacturing a DC-DC converter, according to claim 10, wherein the oxide semiconductor films of the first transistor and the third transistor each comprise any one of an In—Sn—Ga—Zn—O-based oxide semiconductor, an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, an In—O-based oxide semiconductor, a Sn—O-based oxide semiconductor, and a Zn—O-based oxide semiconductor.

12. The method for manufacturing a DC-DC converter according to claim 10, wherein the voltage converter circuit is one of a step-down voltage converter circuit, a flyback voltage converter circuit and a forward voltage converter circuit.

13. A DC-DC converter comprising:
an input terminal to which input voltage is applied;
a voltage converter circuit that is connected to the input terminal and includes a first transistor;
a control circuit that is configured to control the voltage converter circuit and includes a second transistor including a silicon film in a channel formation region; and
a third transistor that is provided between the input terminal and the control circuit and configured to convert the input voltage into power supply voltage,
wherein the first transistor and the third transistor are transistors including an oxide semiconductor film in channel formation regions,
wherein the oxide semiconductor films of the first transistor and the third transistor are stacked over the silicon film of the second transistor with an insulating film provided between the oxide semiconductor films of the first and third transistors and the silicon film of the second transistor,
wherein the third transistor is configured to supply the power supply voltage to the control circuit from one of a source and a drain of the third transistor, and
wherein one of a source electrode and a drain electrode of the third transistor is in contact with the oxide semiconductor film of the third transistor and is provided in an opening portion of the insulating film.

14. The DC-DC converter according to claim 13, wherein the oxide semiconductor films of the first transistor and the third transistor each comprise any one of an In—Sn—Ga—Zn—O-based oxide semiconductor, an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, an In—O-based oxide semiconductor, a Sn—O-based oxide semiconductor, and a Zn—O-based oxide semiconductor.

15. The DC-DC converter according to claim 13, wherein the voltage converter circuit is a step-down voltage converter circuit.

16. The DC-DC converter according to claim 13, wherein the voltage converter circuit is a flyback voltage converter circuit.

17. The DC-DC converter according to claim 13, wherein the voltage converter circuit is a forward voltage converter circuit.

18. The DC-DC converter according to claim 13, wherein a gate of the third transistor is electrically connected to the control circuit.

19. The DC-DC converter according to claim 13, wherein a gate of the third transistor is directly connected to an output terminal of an operational amplifier included in the control circuit.

20. The DC-DC converter according to claim 13,
wherein the one of the source and the drain of the third transistor is electrically connected to the control circuit, and
wherein the other of the source and the drain of the third transistor is electrically connected to the input terminal.

21. The DC-DC converter according to claim 13,
wherein a gate of the third transistor is directly connected to an output terminal of an operational amplifier included in the control circuit, and
wherein the other of the source and the drain of the third transistor is directly connected to both the input terminal and one of a source and a drain of the first transistor.

* * * * *